United States Patent [19]

Lin et al.

[11] 4,042,945
[45] Aug. 16, 1977

[54] N-CHANNEL MOS TRANSISTOR

[75] Inventors: Hung C. Lin, Silver Spring; Marvin H. White, Laurel, both of Md.

[73] Assignee: Westinghouse Electric Corporation, Pittsburgh, Pa.

[21] Appl. No.: 595,458

[22] Filed: July 14, 1975

Related U.S. Application Data

[63] Continuation of Ser. No. 447,178, Feb. 28, 1974, which is a continuation of Ser. No. 257,585, May 30, 1972, abandoned.

[51] Int. Cl.$^2$ .................. H01L 29/78; H01L 27/02; H01L 29/34
[52] U.S. Cl. .......................................... 357/23; 357/51; 357/54; 357/90
[58] Field of Search ............................. 357/23, 54, 51

[56] References Cited
U.S. PATENT DOCUMENTS
3,633,078   1/1972   Dill et al. .................................. 357/23

Primary Examiner—Edward J. Wojciechowicz
Attorney, Agent, or Firm—J. B. Hinson

[57] ABSTRACT

An N-channel MOS transistor wherein two layers of different dielectric materials (e.g., silicon dioxide and silicon nitride) are used in conjunction with a P-doped silicon gate to permit the use of a higher resistivity P-type substrate. This enables a higher junction breakdown voltage and a higher threshold voltage without a reverse bias on the substrate due to an increase in the work function difference between the gate and substrate. Because of the lower concentration (i.e., higher resistivity) of the substrate, high frequency response is increased due to lower drain-source capacitance.

4 Claims, 6 Drawing Figures

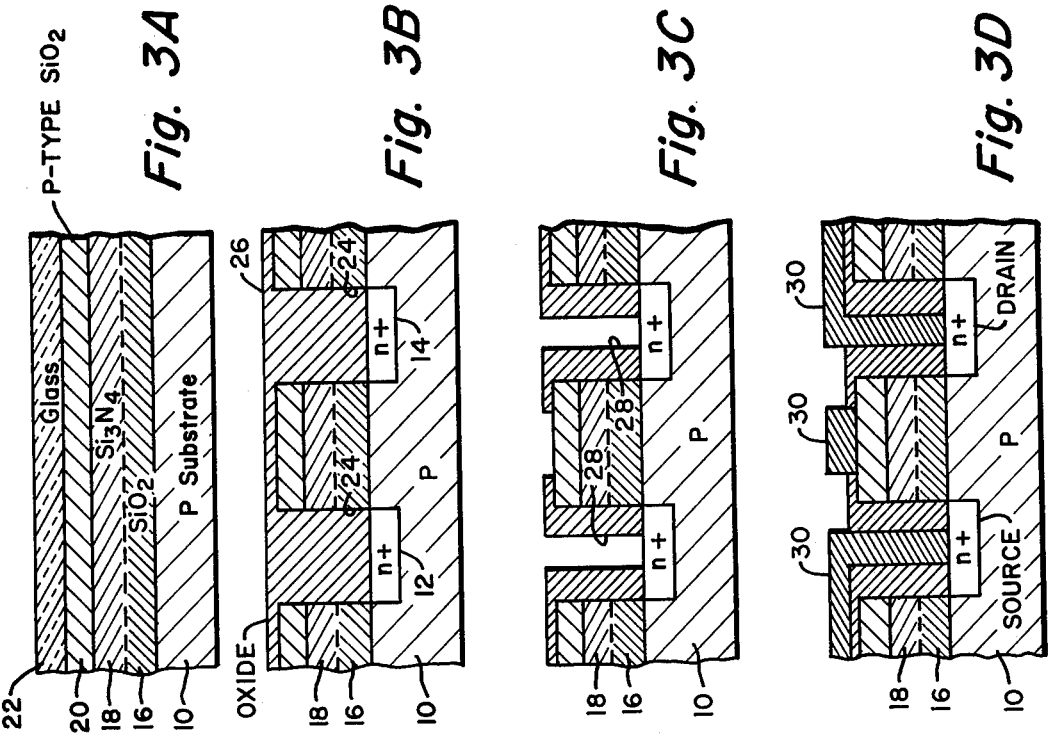
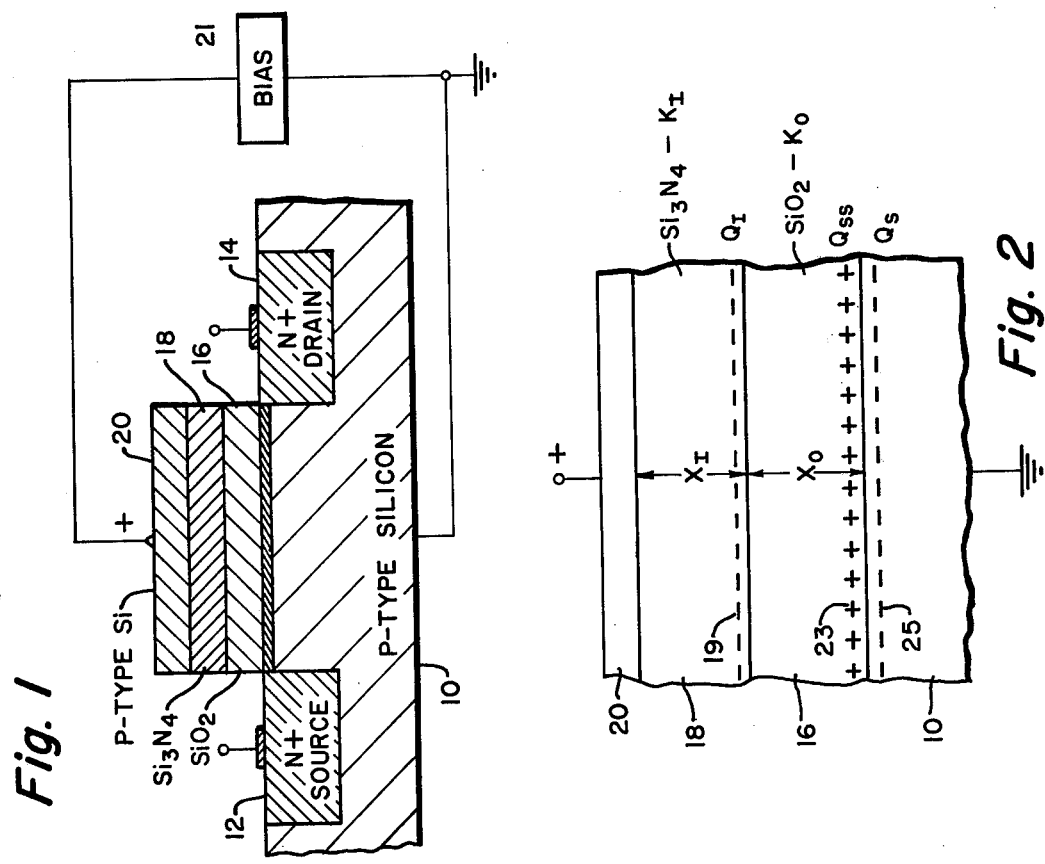

N-CHANNEL MOS TRANSISTOR

This a continuation of application Ser. No. 447,178 filed Feb. 28, 1974 which is a continuation of application Ser No. 257,585 filed May 30, 1972, now abandoned.

BACKGROUND OF THE INVENTION

In digital integrated circuits with metal-oxide semiconductor (MOS) transistors, normally-off enhancement mode devices should be used. Because of the positive surface state charge of an oxidized silicon surface, P-channel MOS transistors are of the enhancement mode. For the same reason, N-channel MOS transistors are likely to be of the normally-on depletion mode unless a low resistivity substrate (high concentration greater than $2 \times 10^{16}$ atoms/cm$^3$) and/or a reverse-biased source-to-substrate junction is used. A substrate of low resistivity lowers the drain breakdown voltage and increases the threshold voltage; while a reverse-biased substrate necessitates an additional power supply as well as an additional terminal. Furthermore, a highly doped P-type substrate of low resistivity results in increased drain-to-source capacitance and reduced operational speed. Thus, it is desirable to fabricate enhancement made N-channel MOS transistors with low background concentration and without reverse biasing the source-to-substrate junction. Such transistors have higher operational speed due to the lower drain-source capacitance and higher drain breakdown voltage which permits high driving voltages.

SUMMARY OF THE INVENTION

In accordance with the present invention, an enhancement mode N-channel MOS transistor is provided having a high resistivity P-type substrate to obtain high breakdown voltage without using a reverse-biased source to-substrate junction to form an enhancement-mode device. This is accomplished by utilizing two effects, namely, (1) the introduction of a negative built-in charge in the insulator with the use of two dielectric layers, and (2) the increase of the work function difference between the gate and the substrate with a P-doped silicon electrode.

The above and other objects and features of the invention will become apparent from the following detailed description taken in connection with the accompanying drawings which form a part of this specification, and in which:

FIG. 1 is a cross-sectional view of the MOS transistor of the invention using a double dielectric between source and drain regions;

FIG. 2 is an enlarged view of the gate and the insulator-substrate cross section showing the charge layers formed therein at the interface between the two dielectric layers and the interface between the lower dielectric layer and the substrate; and FIGS. 3A-3D illustrate, in sequence, the method of fabrication of the MOS transistor of the invention.

With reference now to the drawings, and particularly to FIG. 1, the MOS transistor shown includes a P-type silicon substrate 10 having N+ source and drain regions 12 and 14 diffused into its upper surface. Deposited on the upper surface of the substrate 10, between the drain and source regions, is a layer of silicon dioxide 16; and above the layer of silicon dioxide is a layer 18 of silicon nitride or aluminum oxide. Deposited on the layer 18 is a P-type silicon gate electrode 20.

The P-type substrate 10 has a relatively low impurity concentration of less than 10$^{15}$ atoms per cubic centimeter, meaning that it is high-resistivity type semi-conductive material. As will be appreciated, the device shown in FIG. 1 comprises a field effect transistor in which the usual silicon dioxide gate insulator is replaced by a double insulator comprising a layer of silicon dioxide nearest the silicon substrate and a layer of silicon nitride or aluminum oxide over the silicon dioxide. This gives rise to the existence of traps (electronic states) at or near the silicon dioxide-silicon nitride or aluminum oxide interface as shown in FIG. 2. These traps can be made to have a net negative charge. Thus, assuming that a bias voltage is applied between the silicon gate 20 and the substrate 10 from bias source 21 of FIG. 1, and assuming that the gate is positive with respect to the substrate, an N-channel 25 will be induced by a net positive charge between the source and drain regions in the substrate with a charge density $Q_S$. Negative charges 19 exist at the silicon dioxide-silicon nitride interface in the silicon nitride layer, these charges having a charge density $Q_I$. Similarly, positive charge 23 exists in the silicon dioxide layer at the oxide-substrate interface having a charge density $Q_{SS}$.

It is, of course, desirable to have the threshold voltage $V_{TN}$ of the device greater than zero; and in the case of a field effect transistor using only silicon dioxide, this is normally accomplished by making $Q_S$ much larger than $Q_{SS}$ by a high impurity concentration in the substrate. However, in the present invention, with the gate-substrate work function difference $\phi_{GS}$ being greater than zero and $Q_T$ being smaller than zero, the heavy bulk doping requirement is considerably relaxed so that low doped substrates, having an impurity concentration less than 10$^{15}$ atoms per square centimeter, can be selected. Perhaps this can best be illustrated by a comparison of the applicable equations for determining threshold voltage with a layer of silicon dioxide only as compared with the double layer of the present invention. Thus, for the case where a silicon dioxide layer alone is used:

$$V_{TN} = 2\phi_F + \phi_{GS} - \frac{(Q_{SS} + Q_S) X_o}{K_o \epsilon_o} \tag{1}$$

where:

$V_{TN}$ = N-channel threshold voltage;
$2\phi_F$ = semiconductor surface potential;
$\phi_{GS}$ = gate-to-substrate work function difference;
$X_o$ = thickness of SiO$_2$ layer;
$Q_S$ and $Q_{SS}$ = the charge densities at the SiO$_2$-substrate interface similar to those shown in FIG. 2; and
$K_o \epsilon_o$ = dielectric constant of the SiO$_2$.

Since a normal N-channel enhancement mode field effect transistor of this type has a single layer of silicon dioxide and an aluminum gate electrode, $\phi_{GS}$ is smaller than zero and $Q_I$ equals zero since no silicon dioxide-silicon nitride interface is present and $Q_{SS} > 0$. The use of the single dielectric layer requires $Q_S < 0$ to be much larger than $|Q_S| > |Q_{SS}|$ for the case where the threshold voltage is greater than zero (i.e., the enhancement mode), meaning that the substrate 10 must be of low resistivity and highly doped. This, however, brings on the attendant problems of a low resistivity substrate mentioned above, including low frequency response.

In the device of the invention, on the other hand, the threshold voltage $V_{TN}$ is expressed as follows:

$$V_{TN} = 2\phi_F + \phi_{GS} - \frac{(Q_{SS} + Q_S)}{\epsilon_o} \left( \frac{X_o}{K_o} + \frac{X_I}{K_I} \right) \cdot \frac{X_I Q_I}{K_I \epsilon_o} \quad (2)$$

where:

$X_o$ and $X_I$ = thickness of $SiO_2$ and $Si_3N_4$ or $Al_2O_3$ layers, respectively;

$K_o$ and $K_I$ = relative dielectric constants of the $SiO_2$ and $Si_3N_4$ or $Al_2O_3$ layers, respectively.

The remaining terms are the same as those for Equation (1) above. The device of the invention has a gate-substrate work function difference $\phi_{GS}$ greater than zero and a charge concentration $Q_I$ less than zero. As a result, $Q_S$ can be much smaller than $Q_{SS}$, meaning that a high resistivity P-type substrate can be employed while maintaining a high breakdown voltage.

It is essential that the gate 20 be formed from P-type semiconductive material. In conventional N-channel silicon gate field effect transistors, the gate is doped with the same conductivity type (N-type) as the source and drain. An N-type gate, however, has approximately the same work function as aluminum and results in a lower work function difference between the gate and the P-type substrate. On the other hand, a P-doped gate such as that used in the present invention has a high work function difference by about 1.2 volts. Thus, by combining a P-doped silicon gate and two dielectric layers, an enhancement-mode N-channel MOS transistor is formed.

The fabrication steps of the transistor structure of the invention are shown in FIGS. 3A—3D. As shown in FIG. 3A, the P-type substrate has deposited thereon, in sequence, a layer of silicon dioxide 16, a layer of silicon nitride 18 (or aluminum oxide) and P-doped polycrystalline silicon forming the gate 20. This may be achieved, for example, by using pyrolytic decomposition of silane. Another layer 22 of a masking oxide is grown over the silicon 20. Windows 24 are selectively opened in the multi-layer structure for diffusion to form the source and drain 12 and 14 as shown in FIG. 3B, which is followed by oxidation during drive-in. This forms an oxide coating 26 which fills the windows 24. Windows 28 are then opened by etching techniques for contacts as shown in FIG. 3C. Thereafter, metalization interconnection patterns 30 are delineated and sintered to complete the process shown in FIG. 3D. If the gate is not a closed ring, another polysilicon etching step is required between the first and second masking operations.

Although the invention has been shown and described in connection with a certain specific embodiment, it will be readily apparent to those skilled in the art that various changes in form and arrangement of parts may be made to suit requirements without departing from the spirit and scope of the invention.

What is claimed is:

1. An N-channel enhancement mode field effect transistor comprising:
    a. a substrate of P-type semiconductor material having an impurity concentration less than $10^{15}$ atoms per cubic centimeter;
    b. first and second N-type regions within said substrate, said region respectively forming the drain and source regions of said transistor;
    c. a first layer of dielectric material formed on the surface of said substrate and covering area of said substrate between said drain and source regions;
    d. a second layer of insulating material overlying said first layer;
    e. a layer of P-type silicon deposited on said second insulating layer, said silicon layer forming the gate of said transistor; wherein:
    f. the characteristics and dimension of said substrate, said first and second insulating layers and said layers of P-type silicon are selected to cause the threshold voltage of said transistor, as calculated from the following equation:

$$V_{TN} = 2\phi_F + \phi_{GS} - \frac{(Q_{SS} + Q_S)}{\epsilon_o} \left( \frac{X_o}{K_o} + \frac{X_I}{K_I} \right) - \frac{X_I Q_I}{K_I \epsilon_o}$$

to have a selected positive value.

2. The N-channel, enhancement-mode field effect transistor of claim 1 wherein said substrate of P-type semiconductive material has an impurity concentration less than $10^{15}$ atoms per cubic centimeter.

3. The N-channel, enhancement-mode field effect transistor of claim 1 wherein said first layer of dielectric material comprises silicon dioxide and the second layer of dielectric material is selected from the group consisting of silicon nitride and aluminum oxide.

4. The N-channel, enhancement-mode field effect transistor of claim 1 wherein said second layer of dielectric material comprises silicon nitride.

* * * * *